(12) United States Patent
Harnett et al.

(10) Patent No.: US 12,285,083 B2
(45) Date of Patent: Apr. 29, 2025

(54) METHOD OF ADHERING A MICROELECTROMECHANICAL (MEMS) DEVICE TO A FLEXIBLE FABRIC SUBSTRATE

(71) Applicant: University of Louisville Research Foundation, Inc., Louisville, KY (US)

(72) Inventors: Cindy K. Harnett, Louisville, KY (US); Jasmin Beharic, Louisville, KY (US); Canisha Barbara Ternival, Louisville, KY (US); Sushmita Challa, Louisville, KY (US); Mohammad Shafquatul Islam, Louisville, KY (US)

(73) Assignee: University of Louisville Research Foundation, Inc., Louisville, KY (US)

( * ) Notice: Subject to any disclaimer, the term of this patent is extended or adjusted under 35 U.S.C. 154(b) by 1201 days.

(21) Appl. No.: 16/983,405

(22) Filed: Aug. 3, 2020

(65) Prior Publication Data

US 2021/0353010 A1 Nov. 18, 2021

Related U.S. Application Data

(60) Provisional application No. 62/883,186, filed on Aug. 6, 2019.

(51) Int. Cl.
*H05K 3/30* (2006.01)
*A44B 13/00* (2006.01)
*B81B 1/00* (2006.01)

(52) U.S. Cl.
CPC .......... *A44B 13/0005* (2013.01); *B81B 1/006* (2013.01); *B81B 2201/13* (2013.01)

(58) Field of Classification Search
CPC . B81B 1/006; B81B 2201/13; A44B 13/0005; A41D 1/002
See application file for complete search history.

(56) References Cited

U.S. PATENT DOCUMENTS 9,682,856 B2 * 6/2017 Whitesides ............. G01P 15/18
10,485,103 B1 * 11/2019 Sunshine .......... H01L 23/49838
11,913,143 B2 * 2/2024 Chatham .............. D03D 1/0088

* cited by examiner

*Primary Examiner* — Paul D Kim
(74) *Attorney, Agent, or Firm* — ALGM LLP; Harry J. Guttman

(57) ABSTRACT

Radial-armed thin-film bilayers are designed and fabricated from a metal and an oxide to produce grippers that interact with the yarns or fibers of the fabric and form a mechanical tangle attachment to the fabric. MEMs devices attached to the grippers enable the MEMs devices to be adhered to a flexible and/or extensible fabric. Fabrics comprise conventional textile, smart textiles, functional fibers or other smart materials. The fabrics thus incorporate wearable sensors, medical devices, and other functional MEMs for commercial, biomedical, industrial and scientific applications.

4 Claims, 14 Drawing Sheets

1A

1B

1C

1D

1E

1F

1G

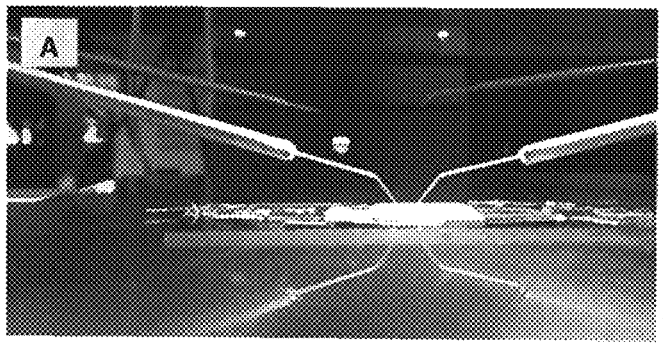
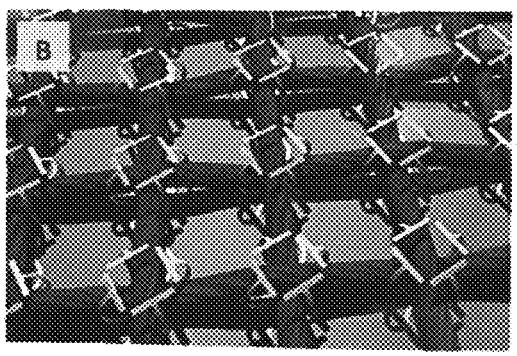
Figure 9A Figure 9B
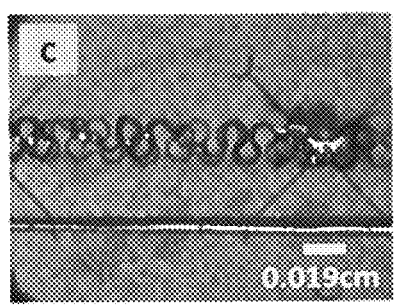
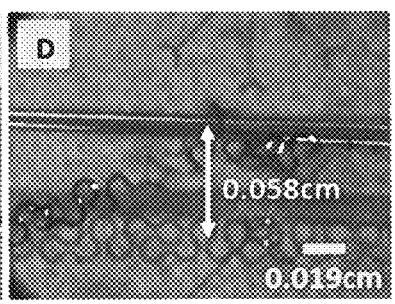
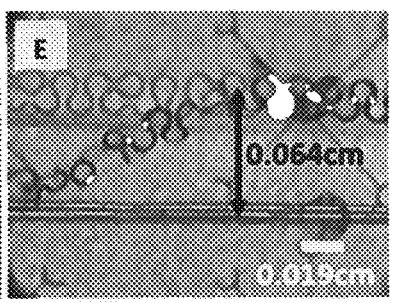
Figure 9C Figure 9D Figure 9E
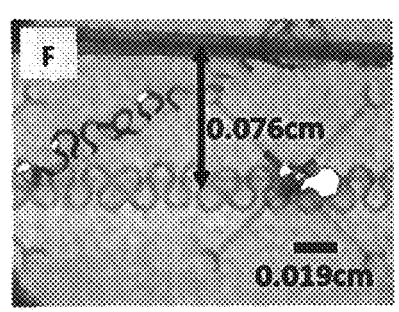
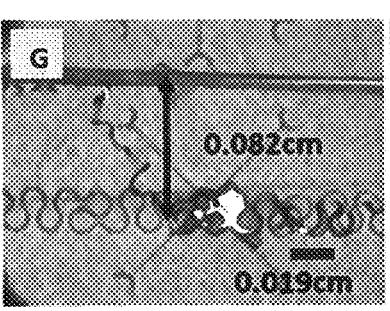
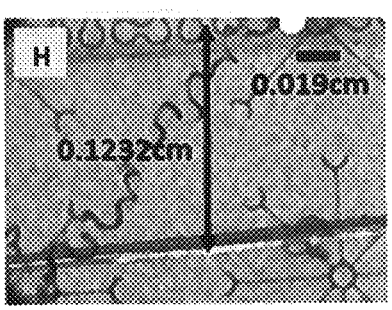
Figure 9F Figure 9G Figure 9H

10A

10B

METHOD OF ADHERING A MICROELECTROMECHANICAL (MEMS) DEVICE TO A FLEXIBLE FABRIC SUBSTRATE

CROSS-REFERENCE TO RELATED APPLICATIONS

This application claims benefit of U.S. Provisional Application No. 62/883,186, filed Aug. 6, 2019, the complete contents of which is hereby incorporated by reference.

STATEMENT OF FEDERALLY SPONSORED RESEARCH AND DEVELOPMENT

This invention was made with government support under Award 1560235, "Interdisciplinary Micro/nano-manufacturing Program Addressing Challenges Today (IMPACT), by the National Science Foundation. The United States government has certain rights in the invention.

BACKGROUND OF THE INVENTION

Field of the Invention

The invention generally relates to microgrippers fabricated from thin-film bilayers. The invention further relates to methods for designing and producing microgrippers and for using the microgrippers to attach microelectromechanical devices to breathable and/or stretchable fabric carriers.

Background

The term "Smart Textiles" refers to a broad field of studies and products that extend the functionality and usefulness of common fabrics. Smart Textiles are defined as textile products such as fibers and filaments, yarns together with woven, knitted or non-woven structures, which can interact with the environment/user. Electrically conductive fibers can also be produced by coating the fibers with metals, galvanic substances or metallic salts. Coatings can be applied to the surface of fibers, yarns, or even fabrics to create electrically conductive textiles. Common textile coating processes include electroless plating, evaporative deposition, sputtering, coating the textile with a conductive polymer.

Common uses for fabric sensors include electrocardiogram, electromyography, and electroencephalography sensing. Fabrics incorporating thermocouples can be used for sensing temperature. Shape-sensitive fabrics can sense movement and can be combined with EMG sensing to derive muscle fitness. Thus, the convergence of wearable and stretchable electronic technologies has pushed microfabricated devices toward new carrier materials, device architectures, and mechanics.

Sensors provide a nervous system to detect signals, thus in a passive smart material, the existence of sensors is essential. The actuators act upon the detected signal either autonomously or from a central control unit. Together with the sensors, they are the essential element for active smart materials, and fabric-based sensing has been a large field of research in the biomedical and safety communities. However, due to the challenges posed by attempting to pair a nonflexible sensor to a flexible fabric, the field has not progressed beyond the stage of functionalized yarns woven into textiles.

Sensors and other electronic devices are made by the thousands on the surface of silicon wafers. The wafers' smooth surfaces and high-purity semiconductor characteristics make extreme miniaturization possible, but silicon wafers are too fragile for sensor applications that require stretching and bending. Fabrics offer the ideal substrate conditions for attachment of wearable sensors, since they can provide lightweight mechanical support and high conduction of air and fluids, but the contact region is non-uniform compared to a cast silicone film. For this reason, adhesion and other printing-based methods to transfer thin-film devices from wafers to fabrics have been difficult to achieve. Over the past ten years researchers have worked to transfer individual devices, and web-like arrays of devices, from the surfaces of semiconductor wafers to soft materials like rubber. The strategy has resulted in soft, stretchable electronics, but since most attachment methods still rely on adhesive films, they do not work well with fibrous surfaces like fabrics where the contact area is small and non-uniform.

Thus, a need exists for a means of attaching wearable sensors to flexible and stretchable fabric carriers. There is currently no technique or product on the market that meets all these needs.

SUMMARY OF THE INVENTION

The invention is microgripper, comprising a radial array of gripper arms made of a thin-film bilayer of metal materials, and having a curvature of the gripper arms that is generated by mismatched tensile and compressive stresses. The mismatched tensile and compressive stresses can be due to a differential in thermal expansion between layers of the thin-film bilayer or by a lattice size mismatch between the layers of the thin-film bilayer.

The microgrippers are useful for attaching microelectromechanical (MEMS) devices to fabric. The fabric may be woven or knitted and is typically flexible. The fabric may also be stretchable or extensible. The microgripper of the invention is useful for adhering MEMS to any type of fabric, including smart textiles, and solves the problem of applying MEMS to flexible or stretchable substrates that are incompatible with or resistant to adhesive materials such as glue, thermoplastic films, or silicon adhesives.

The microgripper comprises metal materials, with a first layer of a metal oxide, and a second layer of a metal. For example, the first layer may be a chromium oxide, and the second layer may be chromium. Thus, in some embodiments, the metal oxide and metal may be of the same metal, and in other embodiments, the first and second layers may be of different metals. Metals that may be used include chromium, nickel, tungsten, tantalum, platinum, gold, silver, aluminum, copper, and titanium, as well as mixed metals and alloys of these metals. The thin-film bilayer typically has a thickness of 50 to 300 nanometers. The number of radial arms is preferred to be 8 arms but can range from 4 to 12 or more. The number of arms required for effective gripping is dependent upon the weave and/or density of the fabric substrate, and may also vary depending on the weight or size of the MEMS payload.

Due to the mismatch between the first and second layers of the bilayer, a curvature is developed in the radial arms after the microgripper is formed. The direction and degree of curvature of the radial arms is determined by a combination of a direction or magnitude of a force, elastic moduli, and a thickness of each layer of the thin-film bilayer. The curving radial arms are grippers that can form a mechanical tangle with a yarn or yarns of a woven fabric.

The gripper arms typically have a length of 100 to 600 microns, with a preferred length in the range of 150 to 220 microns. The width of the gripper arms are typically 10 to 30 microns, and varying depending on weight or size of the payload, or on the weave and/or density of the fabric substrate. The factors of payload and fabric substrate also affect the optional addition of a clasp structure at the termini of the radial arms. Shapes contemplated include a circle, a square, a crossbar, a log, a triangle, a claw or a claw with hooks. The width of the clasp structure is greater than the width of the radial arm width, and may typically be in the range of 20 to 200 microns. In one embodiment, the radial/gripper arms have a length of 150 to 220 microns and the clasp structure is a claw. In another embodiment, the radial/gripper arms have a length of approximately 600 microns. In some embodiments, the measurement of the clasp width is preferred to be approximately 50% of the measurement of the radial arm length.

In another embodiment, the invention is a method of fabricating a microgripper, comprising the steps of growing a metal oxide on a silicon oxide wafer to form a first layer, providing over the first layer a preformed resist pattern of a microgripper having a radial array of gripper arms, applying a second layer of a metal, wherein the metal may be that of the metal oxide or a mixed metal or an alloy which includes the metal of the metal oxide, removing any metal oxide, any metal and at least a portion of the silicon oxide from the silicon oxide wafer in areas not protected by the preformed resist pattern, and releasing the microgripper from the silicon wafer.

In some embodiments, the releasing step is performed by transferring the microgripper directly to a fabric substrate. In other embodiments, the microgrippers are attached to a MEMs device prior to application to the fabric substrate. The fabric substrate may be woven or knitted, and may comprise conventional yarns or fibers, smart yarns or fibers, or a mixture of any of these.

When the microgripper is released form the silicon wafer, the mismatched tensile and compressive stresses generate a curvature of the radial arms, forming a concave face and a convex face. When the concave face is contacted to a fabric substrate, the radial arms curl into grippers that form a mechanical tangle with the yarns or fibers of the fabric. The microgripper may be attached to a MEMs device either before or after the grippers are engaged with the fabric yarns or fibers. The MEMs may be attached to the convex face or the concave face of the microgripper by any attachment means that is suitable for the MEMs and allows it to attach to the metal oxide layer of the thin-film bilayer, such as soldering, adhesives, or solid-state fabrication on the gripper substrate. Additional steps may be added to the method of fabricating a microgripper attached to a MEMs device, when attaching a MEMs to a microgripper, or when adhering the MEMs-microgripper combination to a fabric. For example, a light-emitting diode (LED) or other MEMs device can be applied by a pick-and-place machine to the top of the silicon wafer. Another example is a MEMs that can be created underneath the bilayers using silicon micromachining.

In another embodiment, the invention is a method of adhering a MEMS device to a flexible fabric substrate, comprising the steps of fabricating a plurality of microgrippers, each microgripper having an array of radial arms having a concave face and a convex face, attaching the MEMS device to the convex faces or the concave faces of the plurality of microgrippers, and placing the MEMS device on a desired location on the flexible fabric substrate such that the concave faces of the plurality of microgrippers are in contact with the flexible fabric substrate, allowing the concave faces of plurality of microgrippers to engage with a plurality of yarns or fibers within the flexible fabric substrate, and forming mechanical tangles between the gripper arms and the yarns or fibers that hold the plurality of microgrippers and attached MEMs devices in place.

The MEMS device may be any of a sensor, a diode, a transistor, an LED, an optoelectronic device, and a biomedical device, but is not limited to these devices. The microgrippers may also be used to augment any smart textile to add additional functionality to the overall combination of smart textiles and MEMS held in place by microgrippers.

In yet another embodiment, the invention is a method for a microfabrication process to insert payloads (e.g., diodes, LEDs, photosensors, magnets, electromagnets) into the wafer before microgrippers are released. Microgripper alignment with payloads are made using standard microfabrication steps. Steps are provided to allow 1) full release of payloads and microgrippers at the final step, 2) making payloads small enough to be manageable by thin-film microgrippers, and 3) making reliable electrical contact to payload arrays. In one embodiment of the invention, a microgripper-transferred diode array is a semiconductor payload.

Other features and advantages of the present invention will be set forth in the description of invention that follows, and in part will be apparent from the description or may be learned by practice of the invention. The invention will be realized and attained by the compositions and methods particularly pointed out in the written description and claims hereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIGS. 9A-H shows A) a probe station for mechanical testing; B) a CAD drawing of MEMs-fabric structure, having an array of microgrippers enable by NeXus alignment capability; and mechanical strain tests on MEMs serpentines attached to a fiber with microgrippers, and with the fiber being pulled sideways during testing: C) shows unstretched serpentine structure; and serpentine structure stretched to a displacement of D) 0.058 cm; E) 0.064 cm; F) 0.076 cm; G) 0.082 cm; and H) 0.1232 cm.

DETAILED DESCRIPTION

Figure 1A:
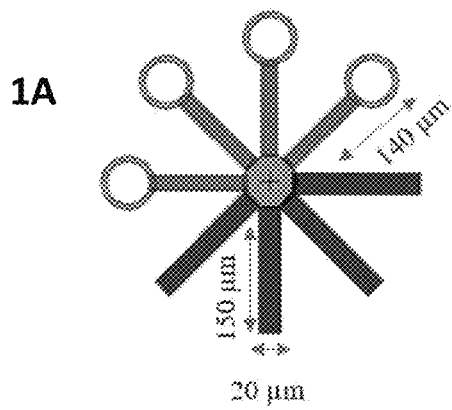
FIGS. 1A-1G shows various embodiments of microgrippers with various clasp structures at the termini of radial arms, including 1A) a circle, 1B) a square, 1C) a cross or cross-bar, 1D) a log or bar, 1E) a triangle, 1F) a claw and 1G) a claw with hooks. Some radial arms are shown without clasp, but embodiments may have clasps at all termini, only one clasp at one termini, or clasps only some of the termini. Measurements indicate approximate width or length. Clasp design scale can vary between FIGS. 1A-1G.
Figure 1B:
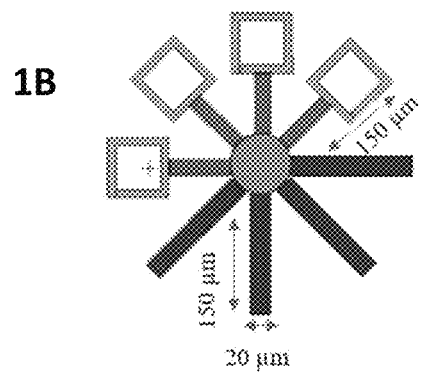
Figure 1C:
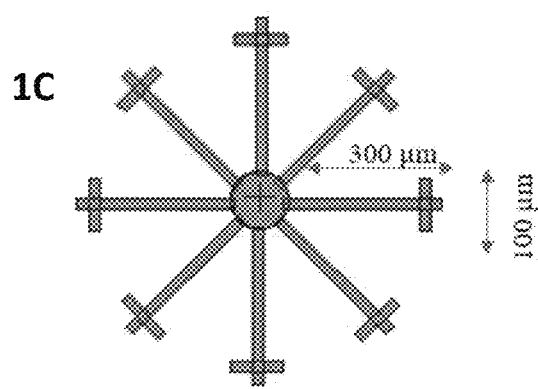
Figure 1D:
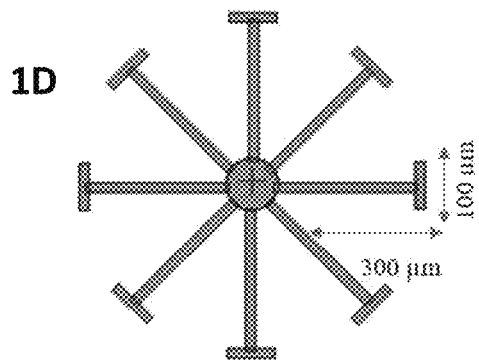
Figure 1E:
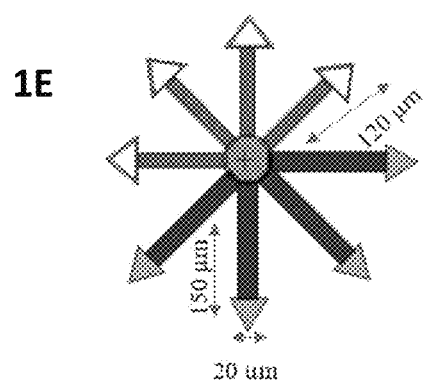
Figure 1F:
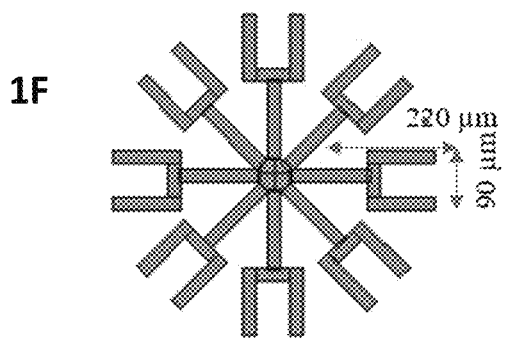
Figure 1G:
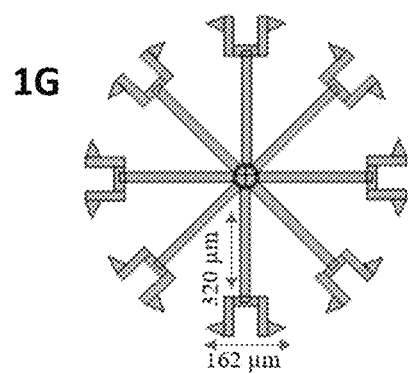

The following descriptions and examples illustrate some exemplary embodiments of the disclosed invention in detail. Those of the skill in the art will recognize that there are numerous variations and modifications of this invention that are encompassed by its scope. Accordingly, the description of a certain exemplary embodiment should not be deemed to limit the scope of the present invention.

In one embodiment, the invention is microgripper, comprising a radial array of gripper arms made of a thin-film bilayer of metal materials, and having a curvature of the gripper arms that is generated by mismatched tensile and compressive stresses. In other words, the first and second layers of the thin-film bilayer have differing properties related to thermal expansion and/lattice size or other physical characteristics. The microgripper typically comprises metal materials, with a first layer of a metal oxide, and a second layer of a metal. The upper metal thin-film layer constrains the expansion of the lower oxide layer while it remains sandwiched against the $SiO_2$ layer. Thus, when released from the silicon wafer substrate, the thin-film bilayer curls with a radius of curvature that minimizes its potential energy. It will be apparent to one who is skilled in the art that a metal and its oxide have differing properties, and this differential is exploited in the invention to fabricate a microgripper having curling arms that are able to form a mechanical tangle with yarns or fibers of a fabric substrate it contacts.

As used herein, the term "thin-film bilayer" is description of both the structure and the formation of the body of the microgripper. In an embodiment, a silicon dioxide wafer is used as a base for fabrication of the microgripper. Other substrates which permit fabrication and release of the microgrippers may also be employed. A first layer is applied to the substrate (e.g. silicon dioxide wafer, silicon wafer, etc.) as a thin-film, and a second layer is applied as a thin-film over the first layer, thus forming a so-called thin-film bilayer.

As used herein, the terms "radial arms" and "gripper arms" refer to the same structures and are interchangeable. The array of radial arms is designed and fabricated using the methods of the invention. When released from the silicon wafer as a fully fabricated microgripper, the radial arms curl up and function as gripper arms of the microgripper.

As used herein, the terms "gripping", "clasping" and "grasping" are used interchangeably to refer to the interaction of gripper arms with yarns, fibers, or other mesh elements of the flexible fabric substrate. Gripping, clasping and grasping also refer to the action of a gripper arm interacting or engaging with the yarns, fibers or mesh to form a connection known in the art as a "mechanical tangle".

In one embodiment, the first layer of the bilayer is chromium oxide, and the second layer is chromium. Thus, in this embodiment, the metal oxide and metal are of the same metal, while in other embodiments, the first and second layers may be of different metals. In addition to chromium, other metals that may be used include nickel, tungsten, tantalum, platinum, gold, silver, aluminum, copper, and titanium. In addition, metal alloys may also be used in at least one layer. In general, any malleable or ductile metal or metal alloy may be used. Selection of metals is based on the suitability of their tensile qualities and the degree of mismatch in any pairing for forming the thin-film bilayer.

The thin-film bilayer typically has a thickness of 0.5 to 2 microns in total, but may be thinker or thinner for some applications. In general, the thickness will be between 0.1 and 50 microns. In a preferred embodiment, the number of radial arms is 8, but this can range anywhere from 4 to 12 or 16 arms or even more arms, depending upon any specific application and or density of fibers in a fabric substrate. The number of arms required for effective gripping is dependent upon the weave and/or density of the fabric substrate. The number of radial arms may also change with the weight or size of the MEMS payload. The number of radial or gripper arms needed to adhere a MEMs device will also be dependent upon the weight or size of the MEMs device of interest. The gripper arms typically have a length of 100 to 600 microns. In a preferred embodiment, the arm length is in the range of 150 to 220 microns. The width of the gripper arms are typically 10 to 30 microns, but these widths can vary depending on weight or size of the payload, or the weave and/or density of the fabric substrate, or on a combination of these factors. Payload and fabric substrate also affect the optional addition of a clasp structure at the termini of the radial arms. Shapes contemplated include a circle, a square, a crossbar, a log, a triangle, a claw, or a claw with hooks. The width of the clasp structure is preferably greater than the width of the radial arm width, typically in the range of 20 to 200 microns. In one embodiment, the radial/gripper arms have a length of 150 to 220 microns and the clasp structure is a claw. In another embodiment, the radial/gripper arms have a length of approximately 600 microns. In general, the length of the gripper arms will range from 1 to 1000 microns. In some embodiments, the measurement of the clasp width is preferred to be approximately 50% of the measurement of the radial arm length.

In another embodiment, the invention is a microgripper or plurality of microgrippers for attaching microelectromechanical (MEMS) devices to fabric. The fabric may be woven or knitted and is typically flexible. The fabric may also be stretchable or extensible. Fabrics that are neither woven nor knitted are also contemplated (e.g., nonwovens, etc.), since these may be formed by mechanical means that results in a mesh structure, at least in a region where a MEMs device is intended to attach. Examples of nonwoven fabric are typically formed from short and long fibers, bonded together by chemical, mechanical, heat, or solvent treatment. Other fabrics manufactured by processes such as melt-blown, spun-laid, flash-spun, and other bonding methods may also be used, as may natural fabric-like substrates, such as leather or suede or felt, especially if these have been perforated to create mesh areas for attachment of microgrippers to the substrate. Thus, the microgrippers of the invention are useful for adhering MEMS to any type of fabric, including smart textiles, and solve the problem of applying MEMS to flexible or stretchable substrates that are incompatible with or resistant to materials such as glue, cement, mucilage, paste or polymer-based adhesives.

In another embodiment, the invention is a method of fabricating a microgripper, comprising the steps of growing a metal oxide on a silicon oxide wafer or other substrate to form a first layer, providing over the first layer a preformed resist pattern of a microgripper having a radial array of gripper arms, applying a second layer of a metal, wherein the metal may, in some applications, be that of the metal oxide or be a mixed metal or metal alloy which includes a metal that is that of the metal oxide, removing any metal oxide, any metal and at least a portion of the silicon oxide from the silicon oxide wafer in areas not protected by the preformed resist pattern, and releasing the microgripper from the silicon wafer.

In some embodiments, the releasing step is performed by transferring the microgripper directly to a fabric substrate. In other embodiments, the microgrippers are attached to a MEMS device prior to application to the fabric substrate. The fabric substrate may be woven or knitted, non-woven, and may comprise conventional yarns or fibers, smart yarns or fibers, or a mixture of any of these.

When the microgripper is released from the silicon wafer, the mismatched tensile and compressive stresses generate a curvature in the radial arms, forming a concave face and a convex face. When the concave face is contacted to a fabric substrate, the radial arms curl into gripper arms that form a mechanical tangle with the yarns or fibers of the fabric. In some embodiments, a microgripper will clasp multiples yarns or fibers within the fabric. Thus, the microgripper may span an interstitial space between yarns or fibers of a woven or knitted fabric, or a microgripper may span a mesh opening in a manufactured or nonwoven substrate. In other embodiments, the microgripper may clasp a single yarn or fiber, or may clasp a single span within a mesh area. The number of microgrippers needed can vary depending on the selection of the fabric substrate's density or weave.

The degree of curvature is dependent upon the selection of materials and design of the radial arms and clasp structures. Three-dimensional out-of-plane structures are assembled from two-dimensional patterns by several different phenomena and result in a wide variety of shapes. Surface tension is used to form boxes or pyramids at the microscale. To produce coiled cantilevers, nano-scrolls and tubes through micro and nano-origami, mismatched tensile and compressive stresses in bilayers is employed. Differential thermal expansion or a lattice size mismatch between layered materials can cause bimorphs to curl uniformly when released from the underlying silicon wafer substrate. The magnitude of the force, elastic moduli, and the thickness of the film decide the curvature of the bilayer objects. The direction of rolling or folding of the patterns is controlled by stresses, shape, and direction of etching. Adhesion forces and collision with other objects can change the shape of the structures, which is an expected outcome when the grippers interact with fabric fibers. Thus, formation of curvature of the microgripper structure and subsequent mechanical tangling between gripper arms and fiber materials is achieved by strain-mismatched bilayer curling and can be guided by choices of metal materials and radial arm measurements.

In one embodiment, the convex side of the microgripper is attached to a MEMS device before the grippers are engaged with the fabric yarns or fibers. In other embodiments, a MEMs device is attached to the concave side of the microgripper. In one embodiment, the microgripper is intercalated within a structure of a MEMs device. For example, the center-point of the radial arm structure may be intercalated within a conductive serpentine structure of a MEMs device. In another embodiment, a plurality of microgrippers are fabricated in a planar layout along a region of a MEMs device so that the microgrippers are incorporated into the structure of the MEMs device. In other embodiments the MEMs device is attached to the convex or concave face of the microgripper by an attachment means suitable for a MEMs device, such as soldering, adhesives, micromachining, or solid-state fabrication on the gripper substrate. The number of microgrippers may vary depending on the size or weight of the MEMs device.

In another embodiment, the invention is a method of adhering a MEMs device to a flexible fabric substrate, comprising the steps of fabricating a plurality of microgrippers, each microgripper having an array of radial arms having a concave face and a convex face, attaching the MEMs device to the convex or concave faces of the plurality of microgrippers, and placing the MEMs device on a desired location on the flexible fabric substrate such that the concave faces of the plurality of microgrippers are in contact with the flexible fabric substrate, allowing the concave faces of plurality of microgrippers to engage with a plurality of yarns or fibers within the woven fabric substrate, and forming mechanical tangles between the gripper arms and the yarns or fibers that hold the plurality of microgrippers and attached MEMs devices in place.

The MEMs device may be any of a sensor, a diode, a transistor, an LED, an optoelectronic device, and a biomedical device, but is not limited to these devices. The microgrippers may also be used to augment any smart textile to add additional functionality to the overall combination of smart textiles and MEMS held in place by microgrippers. The device disclosed herein may be used in products such as a flexible solar cell array, touchscreen, or display. Functional payloads (e.g. diodes, LEDs, photosensors, magnets, electromagnets) may be added to the microgrippers by contacting the electrical connectors to arrays of payloads. In some embodiments, electrical contacts are made using a probe station with sharp needles.

Sensors and other electronic devices are made by the thousands on the surface of silicon wafers. The wafers' smooth surfaces and high-purity semiconductor characteristics make extreme miniaturization possible, but silicon wafers are too fragile for sensor applications that require stretching and bending. Over the past ten years researchers have worked to transfer individual devices, and web-like arrays of devices, from the surfaces of semiconductor wafers to soft materials like rubber. The strategy has proven enormously successful at making soft, stretchable electronics, but since most approaches use adhesive films, they do not work well with fibrous surfaces like fabrics where the contact area is small and non-uniform.

The invention is particularly well-suited to insert sensors and actuators in or on wearable devices that need to be highly porous and breathable, such as athletic gear. It has a special advantage relative to stretchable electronics applied to thin solid films: the porous fabrics allow individual devices to pass from the front side to the back side of the substrate. This type of structure, commonly known in electronics as a "via", normally requires processing to make a hole through a solid substrate, line it with conductive material, and connect it to circuits on the front and back side. The invention also is suited for applications where sensors and other devices need to be surrounded by flowing fluid, because fluid can flow through the porous material and interact with the devices. Examples include a heat-transfer fluid for device cooling, air flows in a HVAC system with embedded sensors, or flowing reactants in a continuous chemical reactor with online process monitoring.

The methods of the invention provide a microfabrication process to insert payloads (diodes, LEDs, photosensors, magnets, and any other MEMs device) into the wafer before microgrippers are released. Microgripper alignment with payloads are made using standard microfabrication steps. Steps are provided to allow 1) full release of payloads and microgrippers at the final step, 2) making payloads small enough to be manageable by thin-film microgrippers, and 3) making reliable electrical contact to payload arrays. In one embodiment of the invention, a microgripper-transferred diode array is a semiconductor payload.

In some embodiments, the invention exploits the properties of mechanical tangling to adhere MEMs devices onto fabric carriers. Strain-engineered microfabricated grippers wrap around the mesh during the final step in our microfabrication process. In addition to smart fabrics and wearable devices described above, applications include sensor integration into breathable structures like tissue engineering scaffolds, bandages and filters are contemplated. Incorporation of MEMs in medical devices provides a means of monitoring remotely or without invasive techniques to acquire data about the healing and/or disease processes.

The fiber-based carrier materials of the invention are compatible with and contribute to electronic textiles (E-textiles), a rapidly emerging field. Smart materials are incorporated into E-textiles by embroidering, knitting, weaving, spinning, braiding, coating/laminating, printing and chemical treatments. The method of mechanical tangling at the microlevel adds a new tool to the E-textiles suite. The microgripper of the invention uses micro-origami, which has uses in numerous applications including biomedical devices, energy storage systems, optoelectronics, MEMs, metamaterials, bendable microelectronics, and origami nanorobots.

Before exemplary embodiments of the present invention are described in greater detail, it is to be understood that this invention is not limited to any particular embodiments described herein and may vary. It is also to be understood that the terminology used herein is for the purpose of describing particular embodiments only, and is not intended to be limiting, since the scope of the present invention will be limited only by the appended claims.

Where a range of values is provided, it is understood that each intervening value between the upper and lower limit of that range (to a tenth of the unit of the lower limit) is included in the range and encompassed within the invention, unless the context or description clearly dictates otherwise. In addition, smaller ranges between any two values in the range are encompassed, unless the context or description clearly indicates otherwise.

Unless defined otherwise, all technical and scientific terms used herein have the same meaning as commonly understood by one of ordinary skill in the art to which this invention belongs. Representative illustrative methods and materials are herein described; methods and materials similar or equivalent to those described herein can also be used in the practice or testing of the present invention.

All publications and patents cited in this specification are herein incorporated by reference as if each individual publication or patent were specifically and individually indicated to be incorporated by reference, and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual dates of public availability and may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as support for the recitation in the claims of such exclusive terminology as "solely," "only" and the like in connection with the recitation of claim elements, or use of a "negative" limitations, such as "wherein [a particular feature or element] is absent", or "except for [a particular feature or element]", or "wherein [a particular feature or element] is not present (included, etc.) . . . ".

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

EXAMPLES

The following Examples provide exemplary designs and methods for fabricating and using microgrippers of the invention. These Examples describe materials and methods for using embodiments illustrated in FIGS. 1-13. Additional details can be found in the section entitled "Brief Description of the Drawings".

Example 1

Various embodiments of radial arrays of gripper arms were designed with lengths in the range of 150 to 360 microns, as illustrated in FIG. 1. The radius of curvature for reliable clasping depends on the fabric being clasped. Various designs were used to fabricate microgrippers and these were then used to test efficiency of adherence to fabric substrates. Radial arm length and widths were varied to provide a range of properties for wrapping or clasping fibers or yarns. Differing clasp structures were designed, since the properties of a clasp affect efficiency of and security of the wrapping or clasping that is required for clinging to the fabric substrate. In general, for fabrics having fibers with a diameter in the range of 50 to 100 microns, the gripper arms with lengths of approximately 200 microns performed best.

The reciprocal of radius of curvature for a released gripper arm of uniform width is given by the calculation $$\frac{1}{\rho} = \frac{6\varepsilon(1+m)^2}{d[3(1+m)^2 + (1+mn)\{m^2 + (mn)^{-1}\}]} \ldots (1) = \frac{6\varepsilon d_1 d_2}{d^3} \quad (2)$$

Figure 2:
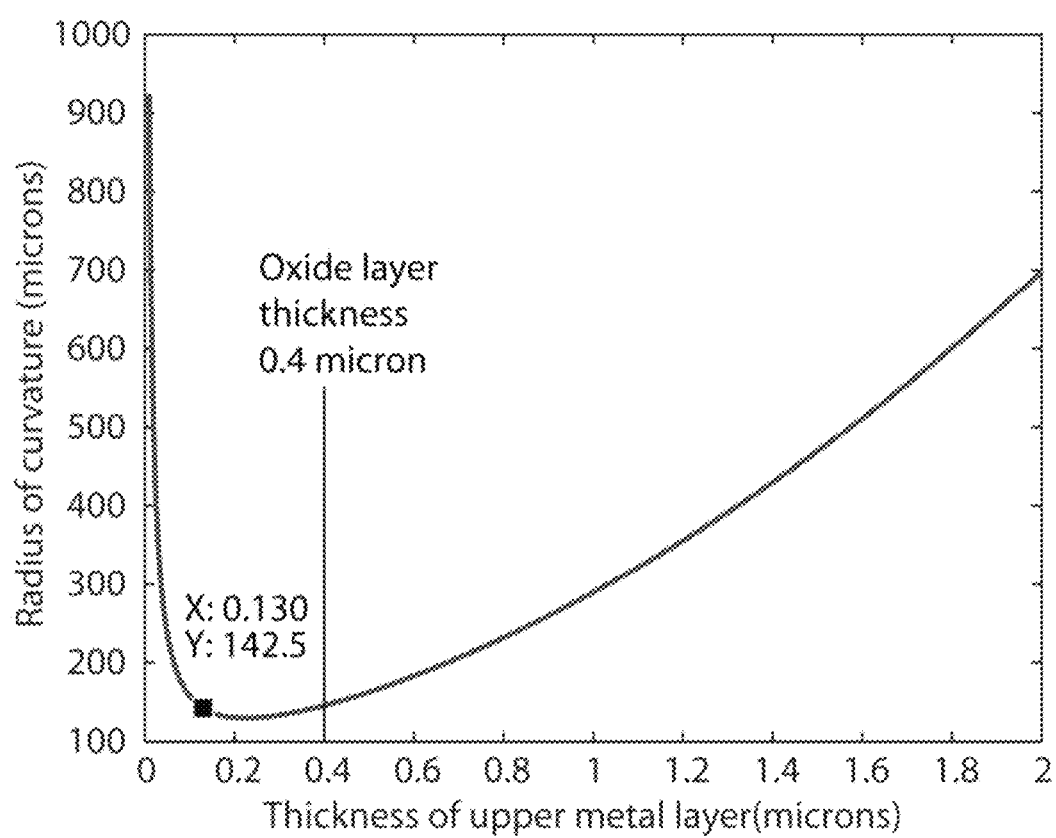
FIG. 2 shows plot of radius of curvature versus thickness of upper metal layer from Equation 1 using parameters shown in Table 1. The minimum radius occurs when the metal layer is approximately half the thickness of the lower metal oxide layer.

Equation (1) reduces to equation (2), if both layers have same biaxial moduli. [1] In the above equation, $\rho$ is the radius of curvature, $d = d_1 + d_2$, combined thickness of two layers, n is the ratio of the elastic modulus of the two layers ($E_1/E_2$) and m is the ratio of their thicknesses, ($d_1/d_2$), $\varepsilon$ is the strain mismatch given as follows, $$\varepsilon = \frac{\sigma_{Metal}(1 - \nu_{Metal})}{E_{Metal}} - \frac{\sigma_{oxide}(1 - \nu_{oxide})}{E_{oxide}} \quad (3)$$

where $\sigma$ is the biaxial stress, $\nu$ is the Poisson's ratio, E is the elastic modulus. The choice of the thickness of upper metal layer in the bimorph greatly affects the radius of curvature. From equation (1), with a $SiO_2$ layer thickness of 400 nm, and other parameters as listed in Table 1, a plot showing radius of curvature versus thickness of upper metal layer is obtained, as shown in FIG. 2.

Figure 3:
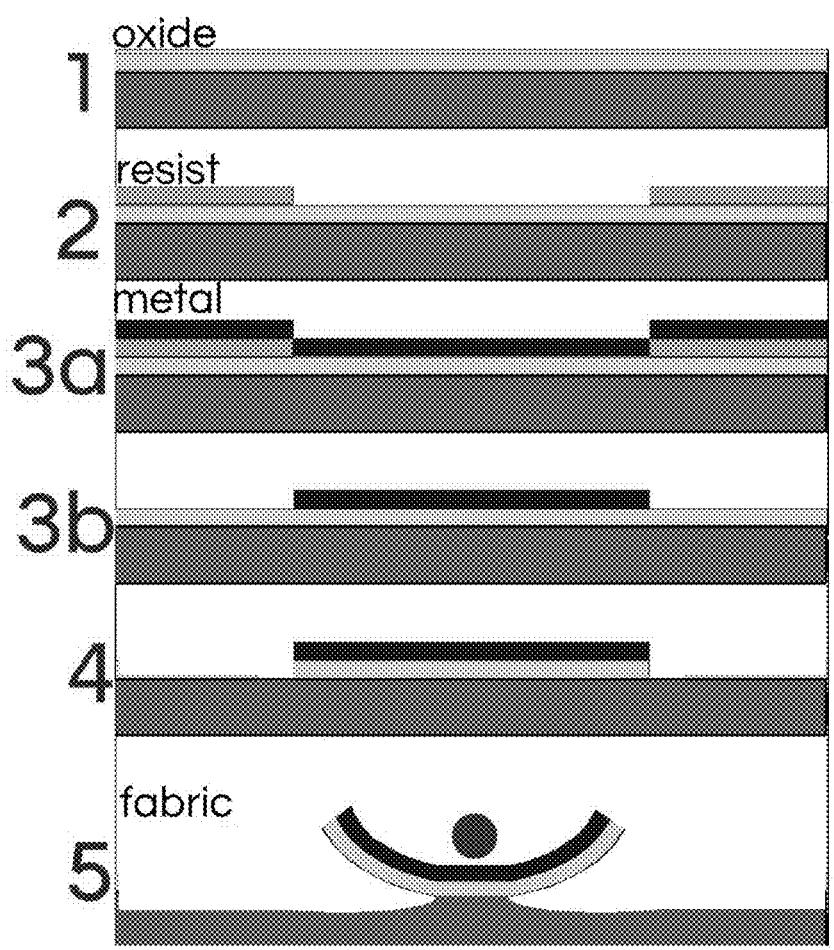
FIG. 3 shows 1) thermal oxide deposition, 2) microgripper pattern applied with photolithography, 3a) chromium deposition by sputtering, 3b) metal lift-off in NMP solvent, 4) wafer dicing and oxide etching using the metal as a mask, 5) partial release from wafer, illustrating formation of a curvature with a concave face and a convex face. In some embodiments, fabrics are tightly attached over the chips to bring the concave face in contact with the fabric. Silicon may be etched by xenon difluoride through the fibers, leading to full release of the microgripper structures.

As diagramed in FIG. 3, designs illustrated in FIG. 1 were used to fabricate microgrippers with the following steps:

Step 1. A 400 nm thick thermal oxide was grown on silicon wafers by wet oxidation in a tube furnace at 1000° C.

Step 2. Standard photolithography and etching were used to pattern Cr metal into the designs of FIG. 1.

Step 3a. To produce the metal thickness and stress values in Table 1, a sputtering machine (PRO Line PVD 75, Kurt J. Lesker Co.) was used to sputter coat the silicon wafers from a Cr target using 300 W DC power, 5 mTorr argon pressure and 15-18 minutes of deposition time.

Steps 3b-4. The oxide was removed by plasma etching everywhere except where it was protected by the metal pattern. For achieving plasma etching, wafer dices were processed in a March plasma etcher for 10 minutes with 240 mTorr pressure of CF4:H2 at a partial pressure ratio of 60:40 and a RF power of 260 W.

Step 5. Various fabrics (matte tulle fuschia 100% nylon, Casa Collection chiffon chocolate 100% polyester, Glitterbug micro-net fabric white 100% nylon, Jo ANN Fabrics) were attached tightly over the surface. The microgripper structures were released using a Xactix® $XeF_2$ Release Etch chamber (SPTS Technologies Ltd; UK) to undercut them from the wafer by a 10 micron deep isotropic silicon etch. For grippers with arm widths in the range of 15 microns, the etch process required 30 or more 30 s cycles of exposure to an atmosphere of 3 Torr $XeF_2$ for complete release. Partial release, i.e., leaving grippers tethered to the wafer at their centers, could be achieved by reducing the number of etch cycles.

Example 2

Figure 4A:
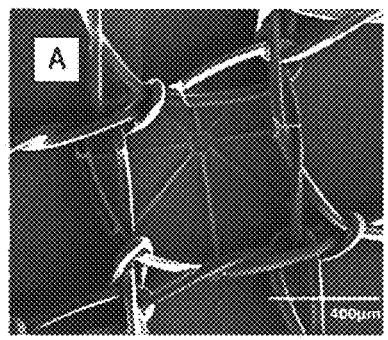
FIGS. 4A-G are images showing A) a microgrippers clasping yarns of a mesh fabric; B) a microcarrier intercalated with a conductive serpentine structure, having gripper arms clasping onto a single fiber and adhering the serpentine structure to the fiber, C) microgrippers clasping onto a copper wire, and D)-G) showing various examples of microgripper interactions within a knitted fabric.
Figure 4B:
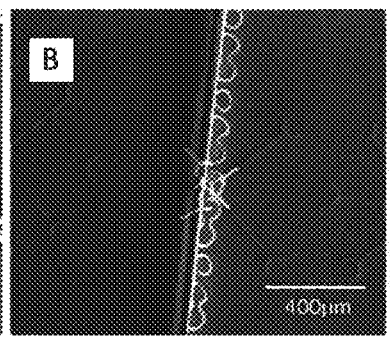
Figure 4C:
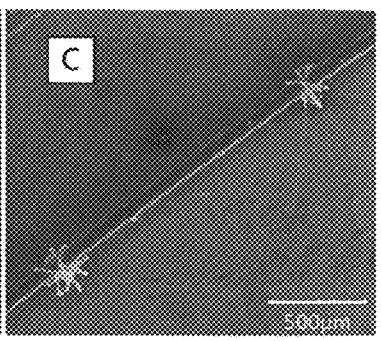
Figure 4D:
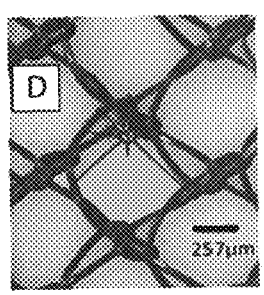
Figure 4E:
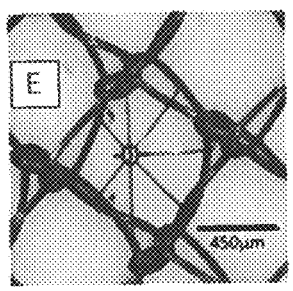
Figure 4F:
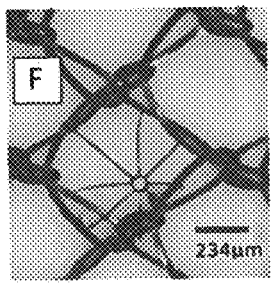
Figure 4G:
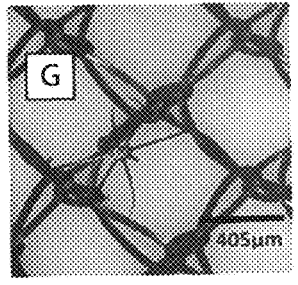
Figures 5A, 5B, 5C, 5D:
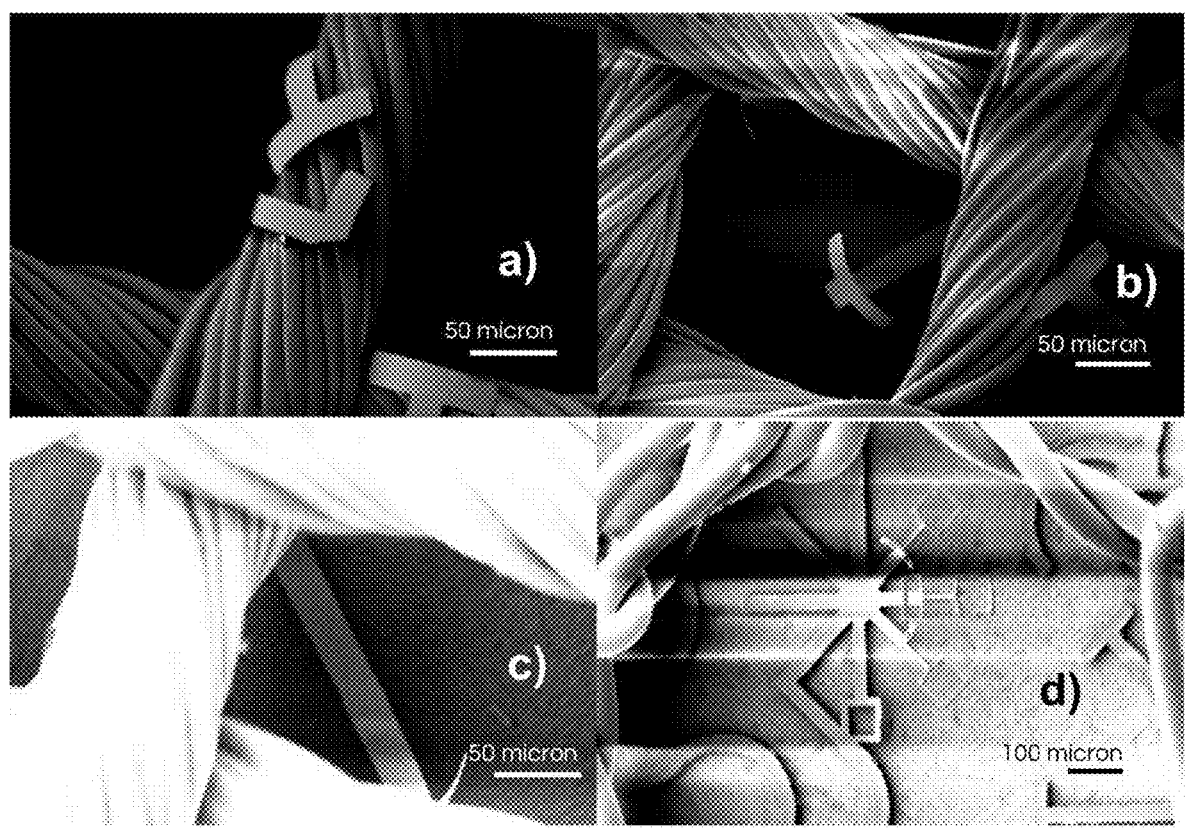
FIGS. 5A-D shows "pop-up" errors of microgrippers interacting with fabric substrates, including A) broken corners, with highlight to show a MEMS device; B) too-short grippers; C) crushing by misaligned fabric; and D) missed connections.
Figures 6A, 6B, 6C, 6D:
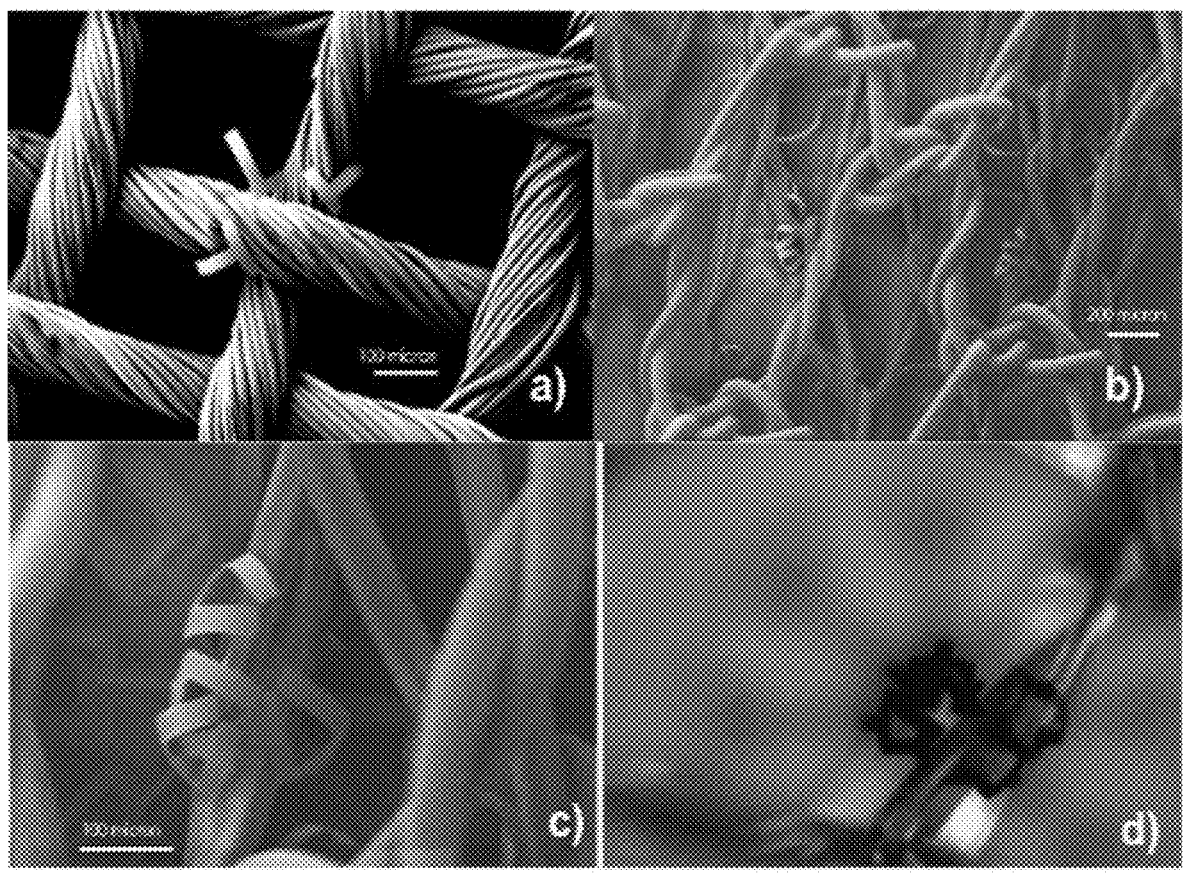
FIGS. 6A-D shows "pop-up" successes of microgrippers interacting with fabric substrates. In a successful interaction, the fabric does not interfere with MRMS processing and fabric is not damaged. As shown in A), with a woven polyester fabric (white scale bar=100 microns); B) with a knit nylon fabric (white scale bar=200 microns), C) an enlargement of the image shown in B (white scale bar=100 microns), showing secure clasping of 50 micron diameter fibers by the "crab claw" design; and D) an optical micrograph of the knit nylon fabric showing the interaction between polymer fibers and microgrippers. Scale bars shown in microns.

Interactions between microgrippers and fabrics were analyzed. Scanning electron microscopy and optical microscopy were used to evaluate the radius of curvature and transfer of microgrippers from silicon wafers to fabrics using the strain energy based "pop-up" process. FIG. 4A shows a microgrippers clasping yarns of a mesh fabric. FIG. 4B shows a microcarrier intercalated with a conductive serpentine structure, having gripper arms clasping onto a single fiber and adhering the serpentine structure to the fiber. FIG. 4C shows microgrippers clasping onto a copper wire. FIGS. 4D-4G show various examples of microgripper interactions within a knitted fabric.

Film stress was measured on 4-inch diameter wafers using a FLX-2320 film stress monitor (Toho Technology; Chicago, IL). The properties in Table 1 (a 400 nm oxide, and a 130 nm thick Cr layer) produced structures with a radius of curvature ranging from 100 to 193 microns, for an average of 144±41 microns, based on measurements from 6 structures. For the microgripper-to-fabric transfer process, imperfections included missed connections, too-short grippers, crushing of grippers by misaligned fabric and missed con-

TABLE 1

Properties of chromium thin-film bilayer microgrippers

| Material | Elastic Modulus (GPa) | Poisson's Ratio | Measured Thickness (nm) | Measured Residual Stress (MPa) | Calculated Radius (microns) |
|---|---|---|---|---|---|
| Cr | $E_{Metal} = 140$ | $\nu_{Metal} = 0.21$ | 130 | $\sigma_{Metal} = 160 \pm 5$ (tensile) | 142 ± 5 |
| Oxide | $E_{Oxide} = 71$ $E_{Oxide} = 83$ | $\nu_{Oxide} = 0.20$ | 400 | $\sigma_{oxide} = -300 \pm 25$ (Compressive) | | nections, as shown in FIGS. 5A-D. Interactions between microgrippers and fabrics were determined to be successes when the fabric was not visibly damaged and when the fabric did not interfere with MEMs processing. As shown in FIGS. 6A-D, successful transfer was demonstrated with examples of woven fabrics and knit fabrics. For the materials and thicknesses in Table 1, structure lengths of 200 microns and greater are sufficient for hooking and clasping fibers of polyester and nylon woven and knit fabrics having fiber diameters in the 50- to 100 micron range, and having mesh openings in the 500 micron to 1 mm diameter range. Features such as crossbars and a "crab claw" (FIG. 1F and FIG. 6C) spanned more of the fiber surface. Embodiments for MEMs devices that rely on contact area for adhesion are preferred to have such features at the ends of the grippers. The three "clasp" designs, some of which are shown in FIGS. 1-G, are better suited for fibers having a smaller diameter, since these radial arms of less than 200 microns did not surround these fibers at the ~150 micron radius of curvature.

From this example, it will be apparent to one of skill in the art that clasp designs with longer or shorter arms will be suitable for fabrics with larger or smaller fibers/yarns or with looser or tighter weaves/knits. An efficient spatial use of grippers as illustrated in FIG. 4A-G and FIG. 6A-D is achieved by matching gripper arm design and size accordingly with the properties of a fabric of interest. In addition, an increased gripper density helps achieve a strong bond between a thin-film device array and a fabric. By increased gripper density, we mean the number of gripper arms per microgripper, and/or an increased number of microgrippers attached to a MEMs device. In some embodiments, the claw tips increase the contact area and entanglement. In some embodiments, the arms are lengthened to improve transfer from silicon wafer to fabric.

The mechanical strength of the connection of microgrippers to a fabric substrate may be measured using the strain tests illustrated in FIGS. 5A-D and 6A-D, or it may be tested by flowing water past or through a fabric having an attached MEMs device, or within a microfluidic channel of a MEMs device.

Embodiments of the disclosure may be used to insert sensors and actuators in wearable devices that need to be highly porous and breathable, such as athletic gear. It has a special advantage relative to stretchable electronics applied to thin solid films: the porous fabrics allow individual devices to pass from the front side to the back side of the substrate. This type of structure, commonly known in electronics as a "via," normally requires processing to make a hole through a solid substrate, line it with conductive material, and connect it to circuits on the front and back side. Embodiments of the invention may also be used where sensors and other devices need to be surrounded by flowing fluid, because fluid can flow through the porous material and interact with the devices. Examples include a heat-transfer fluid for device cooling, air flows in a HVAC system with embedded sensors, or flowing reactants in a continuous chemical reactor with online process monitoring.

Example 3

Figures 7A, 7B:
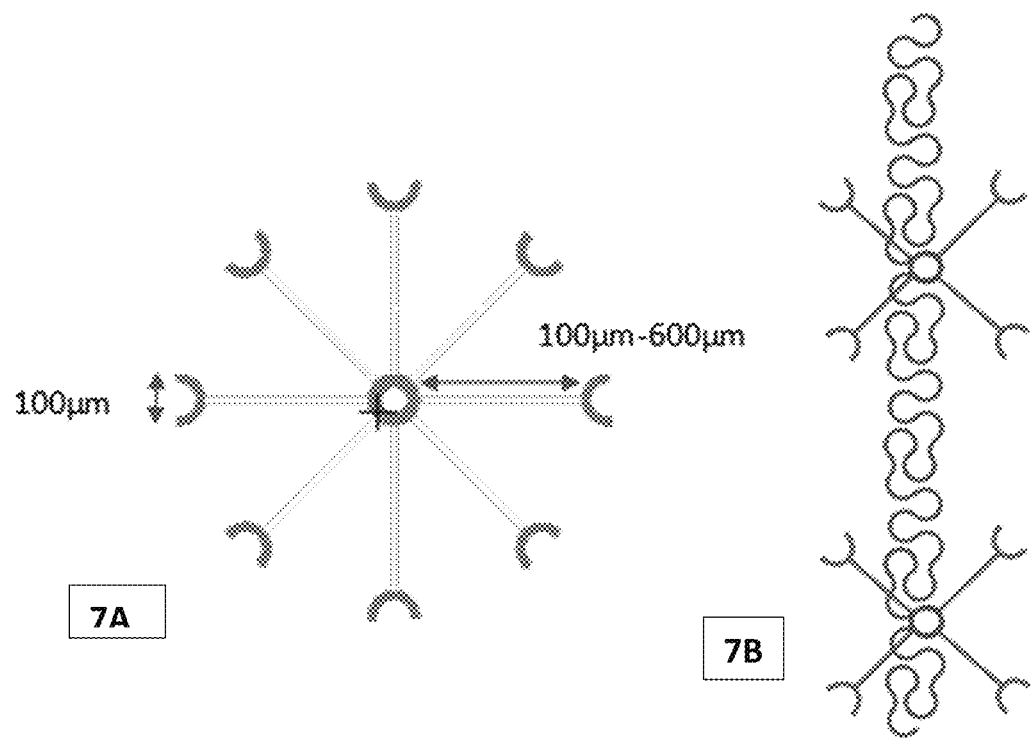
FIG. 7A shows an array of radial arms for a microgripper design for clasping onto mesh)
FIG. 7B shows a microgripper design intercalated with a serpentine structure for mechanical contact with a single strand of fiber.
Figure 8:
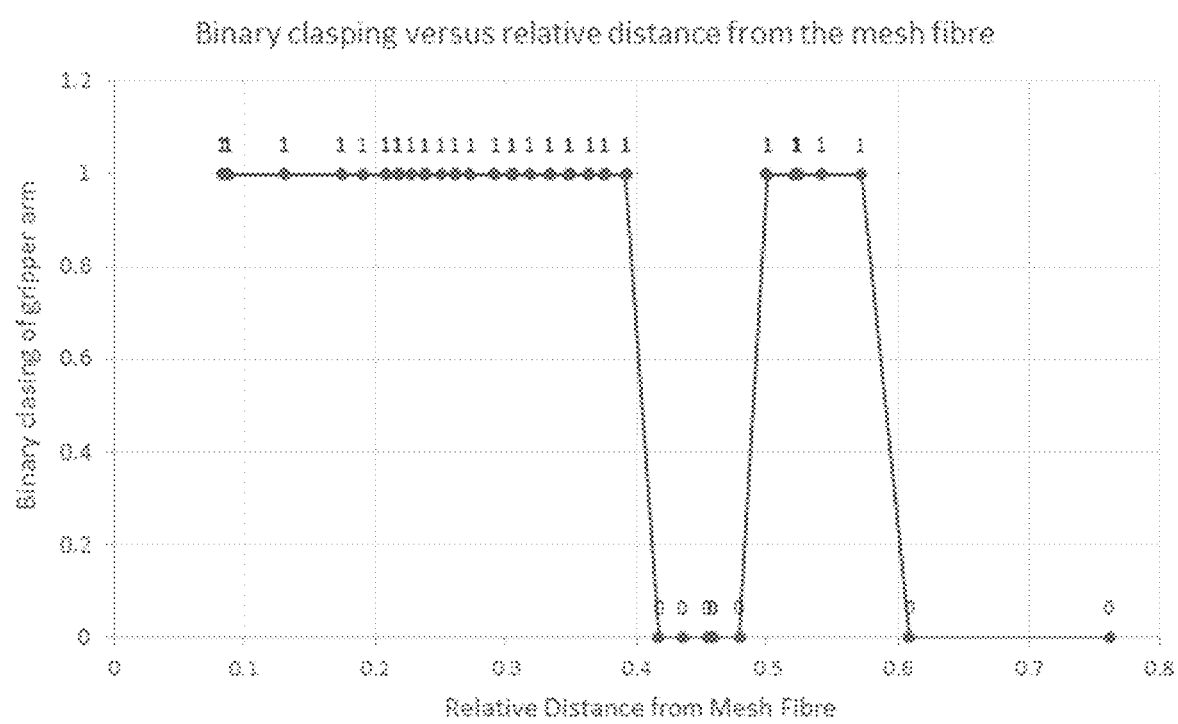
FIG. 8 is a graph showing alignment tolerance for gripper arms 600 micron in length.

A microgripper is designed to clasp a flexible fabric substrate and adhere a MEMs device to the fabric. FIG. 7A shows a radial arm design for the microgripper, having a radial arm length of approximately 600 microns. FIG. 7B shows the microgripper design is able to intercalate with a serpentine structure, thus providing a means for attaching the serpentine structure to the flexible fabric substrate. The microgripper of FIGS. 7A-B was fabricated using the method disclosed in Example 2. The coupled MEM-gripper unit was tested for compatibility with fabrics, also using methods disclosed in Example 2 and as illustrated in FIG. 4A-G. To verify compatibility and stability of the MEM-gripper and fabric adherence, alignment tolerance was measured. FIG. 8 shows a graphic illustration of binary clasping vs relative distance from the mesh fiber. The alignment tolerance for a gripper arm having a 600-micron was identified as having the fiber axis within 400 microns of the center of the microgripper to allow for successful grasping. The MEM-gripper unit was tested for successful gripping as illustrated in FIG. 6A-D in Example 2.

Example 4

MEM-gripper units coupled with serpentine structures such as the one illustrated in FIGS. 7A-B of Example 2 were tested for mechanical strength and stability. MEM-grippers were clasped on elastic fibers with the serpentine still attached to the silicon wafer at a distal point and subjected to mechanical pull tests. FIG. 9A shows a probe station for mechanical testing. FIG. 9B shows a CAD drawing of MEMs-fabric structure, having an array of microgrippers enable by NeXus alignment capability; and mechanical strain tests on MEMs serpentines attached to a fiber with microgrippers, and with the fiber being pulled sideways during testing. FIG. 9C shows unstretched serpentine structure; and serpentine structure stretched to a displacement of FIG. 9D) 0.058 cm; FIG. 9E) 0.064 cm; FIG. 9F) 0.076 cm; FIG. 9G) 0.082 cm; and FIG. 9H) 0.1232 cm. The mechanical pull tests demonstrate that the MEM-gripper units holds to the serpentine structure and stretches it as the elastic fiber is displaced with the probe. An electromechanical test is also performed with a probe station having integrated contact pads for measuring electrical resistance.

Example 5

Figure 10:
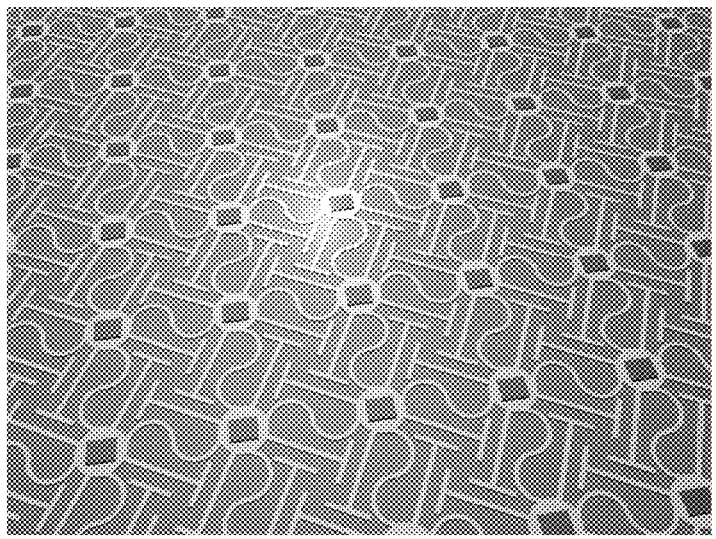
FIG. 10 shows a top-view rendering of microgrippers with gripper arms in a planar layout (upper) and interacting with fibers after release to a grid of woven fabric (lower). The microgrippers each have 4 radial arms and are integrated into a planar layout representing a MEMS device.
Figure 10:
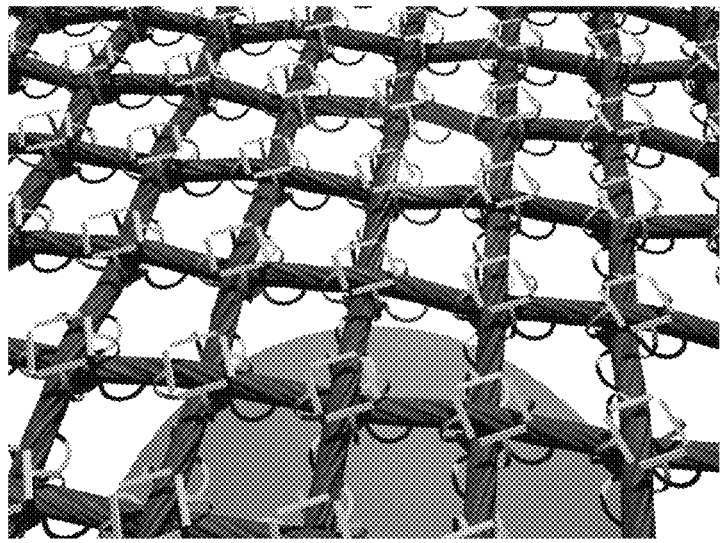

A MEM-gripper array is designed to provide a relatively simple semiconductor payload. FIG. 10 shows a CAD image of microgrippers arrayed and intercalated with a semiconductor payload (upper panel) for transfer to a fabric swatch (lower panel), creating a porous structure with mechanical strength coming from fibers and functionality from the MEMs device, such as diode array payload illustrated here.

Example 6

A MEMs-to-fiber NeXus fiber loom system can be used to place woven fabric junctions at known locations for alignment with microgripper on silicon wafers. The loom is an AVL K-series designed for complex or technical weaving with 16 harnesses, automatic fabric advance, and CompuDobby® computer integrated weaving system (AVL Looms, Inc; Chico CA). Sensors may be added to aid in machine integration, software, and fabric auto-advance. The fiber loom module uses a camera on a NeXus robot arm to identify alignment points on a piece of fabric under construction. MEM-gripper units with ~1 cm long folded serpentine traces make stretchable electronic connections between fabric attachment points. The MEM-gripper units can be randomly aligned with fiber junctions in the fabric, manually aligned with single fibers, or targeted to fiber junctions at specific locations in the woven fabric.

Figure 11:
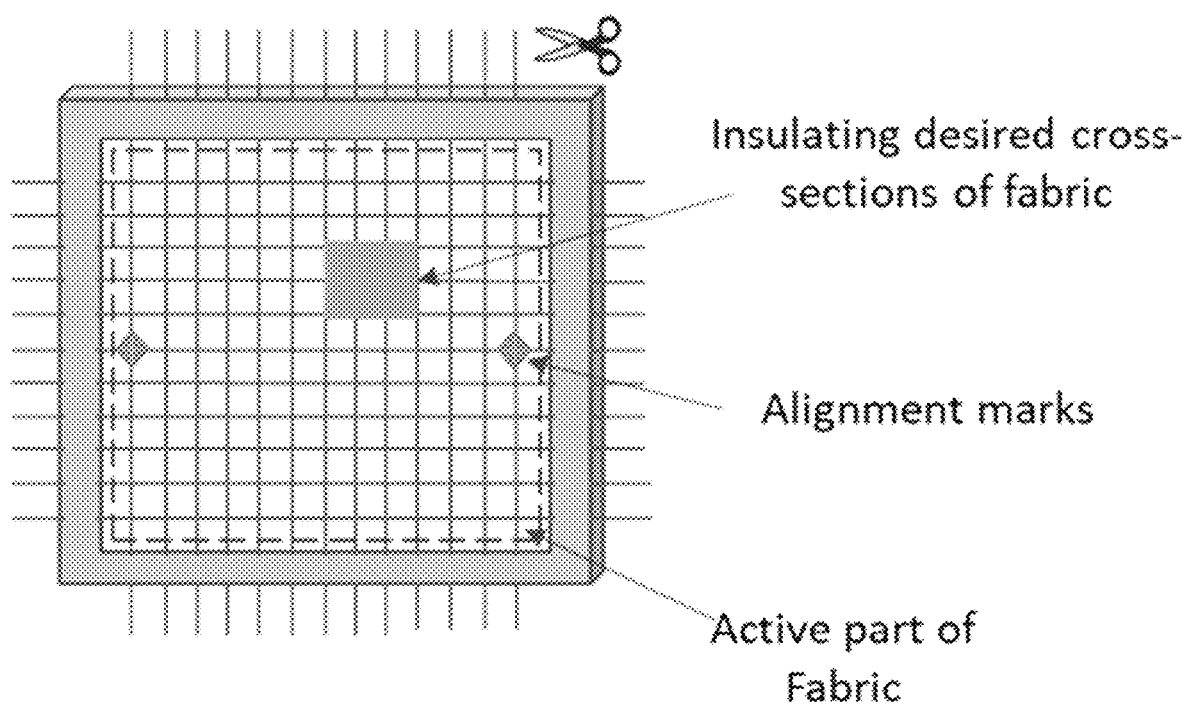
FIG. 11 shows alignment marks and frame printed on clamped woven fabric from *NeXus* fiber module.

The steps, as illustrated in FIG. 11, are:

Step 1. Combined printing and weaving: Using camera to identify reflective warp threads while the fabric is still clamped in registration with the loom, align a 3D print arm to woven material. Print a frame (5×5 cm) with alignment marks registered with fibers.

Step 2. Remove frame from weaving station, leaving fibers ready to go for the next frame.

Step 3. Transfer the frame to the alignment station. Align the frame to a silicon wafer with devices ready to release.

Figure 12:
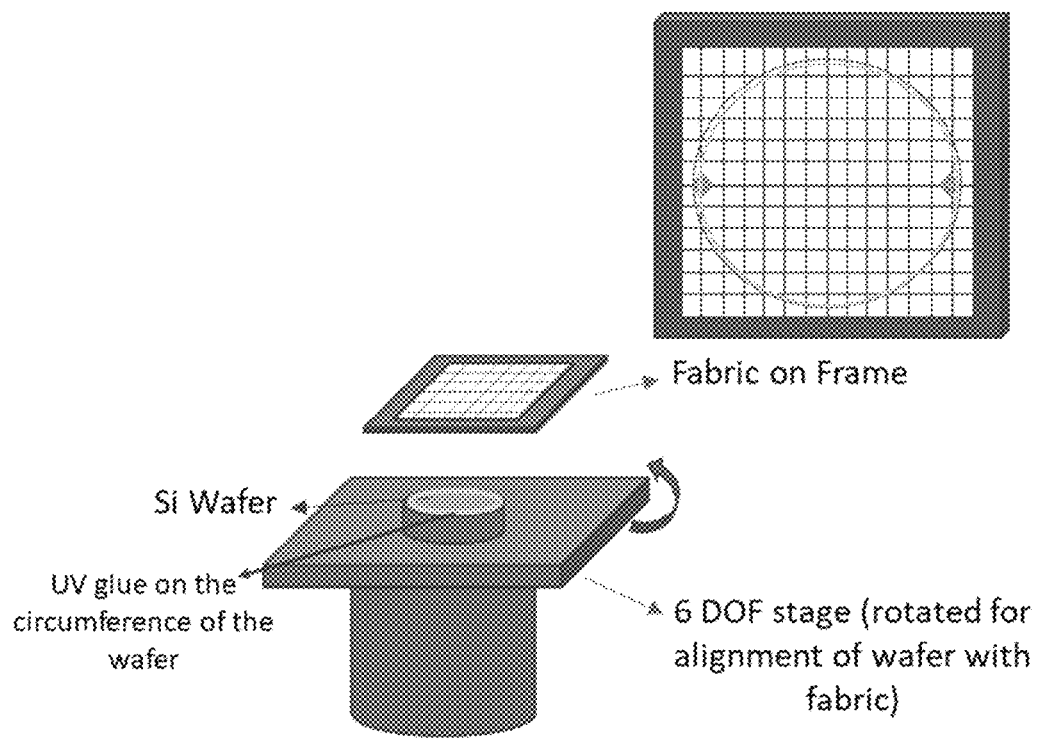
FIG. 12 shows Nexus alignment stage used to position woven frames in registration with silicon wafers for MEMs-to-fiber attachment.

Step 4. Adhere wafer and frame with ultraviolet curable glue, as shown in FIG. 12. Transfer the wafer and frame to $XeF_2$ etching machine; process to release MEM-gripper unit onto fibers.

Figure 13:
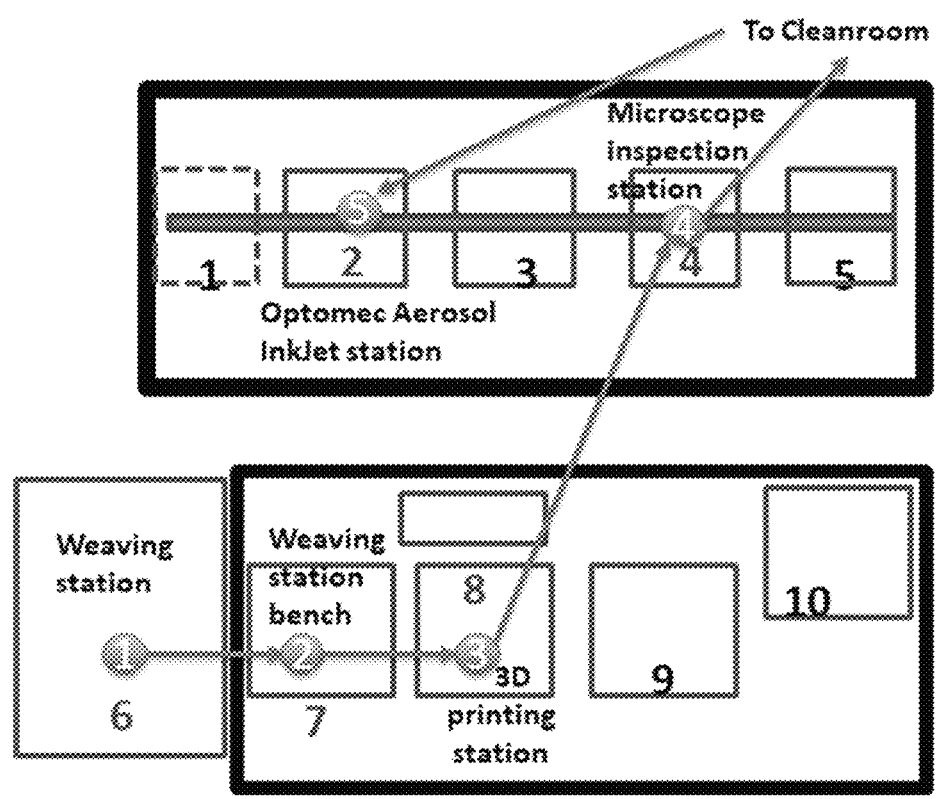
FIG. 13 shows the path of MEMs-to-fiber attachment using the NeXus system.

Step 5. Optionally, after grippers have popped up from the wafer, transfer the frame back to the NeXus system for aligned metal deposition using an aerosol jet printing system (Optomec, Inc; Albequerque NM) to increase the surface area of metal on the contact regions of the array. FIG. 13 shows a diagram of a typical workflow using the NeXus fiber loom system.

Circled numbers 1-5 depict the workflow route for producing a MEMS-fabric hybrid:

1. Weaving station produces fabric with junctions at known locations.
2. Fabric is glued into a frame and cut at the weaving station bench.
3. Alignment features are added to the fabric at the 3D printing station.
4. Alignment is verified at the microscope inspection station. The sample goes to the cleanroom for alignment and release of MEMS devices from the silicon wafer to individual fiber junctions.
5. Additional electrical connections are made with the Optomec Aerosol InkJet station.

Numbers 1-10 depict workstations in an example of a micro manufacturing workcell such as the NeXuS station at the University of Louisville: 1. oven. 2. Optomec Aerosol inkjet station. 3. Intense Pulsed LIght station. 4. Microscope inspection station. 5. Precision 6-axis sage. 6. Weaving stage. 7. Weaving station bench, 8. 3D printing station. 9. Laser cutter. 10. Solder paste dispensing station.

The system can be used validate designs and construction, as well as generate smart fabrics with MEM-gripper units attached to fabrics. A soft interconnect system brings MEMs electrical contacts through the thickness of a material. A soft connector is a composite material rather than a self-contained electronic device. The system can also integrate a functional fiber, such as an optical, electrical, or actuation fiber, with signal conditioning and communication electronics. A key advantage of the fiber loom system is the ability to put functional fibers in known positions with respect to conventional senor components. Thus, instead of using a silicon wafer as the source of MEM-gripper units, the system uses NeXus' pick-and-place capability to precisely and accurate position the MEM-gripper units.

Example 7

Figure 14:
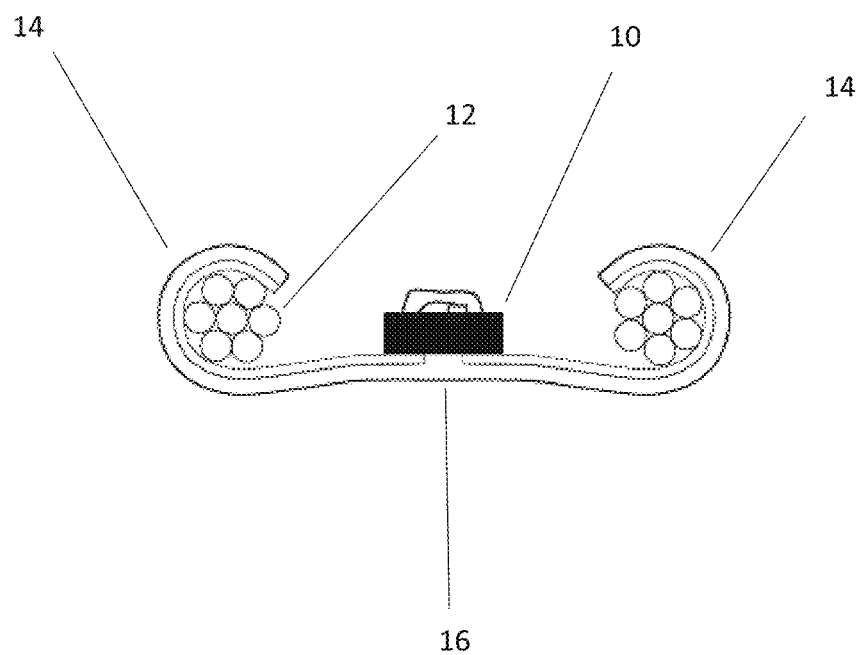
FIG. 14 is a schematic drawing showing a MEMs device connected to a fabric by one or more microgrippers.

An LED MEMs device with two terminals was applied by a pick-and-place machine to the top side/concave face of one or more microgrippers. The microgrippers were placed in contact with a fabric and the gripper arms formed a mechanical tangle with the fabric fibers. FIG. 14 shows cross-section view of an exemplary embodiment of the invention where a MEMs device 10 is mechanically connected or adhered to a fabric substrate 12 by one or more gripper arms 14 of a microgripper 16. Thus, the microgripper 16 is connected to both the fabric substrate 12 and the MEMs device 10.

While the invention has been described in terms of its several exemplary embodiments, those skilled in the art will recognize that the invention can be practiced with modification within the spirit and scope of the appended claims. Accordingly, the present invention should not be limited to the embodiments as described above, but should further include all modifications and equivalents thereof within the spirit and scope of the description provided herein.

We claim:

1. A method of adhering a microelectromechanical (MEMS) device to a flexible fabric substrate, comprising the steps of:
fabricating a plurality of microgrippers, each microgripper having an array of radial arms having a concave face and a convex face;
attaching the MEMS device to the convex or concave faces of the plurality of microgrippers;
placing the MEMS device on a desired location on the flexible fabric substrate such that the concave faces of the plurality of microgrippers are in contact with the flexible fabric substrate;
allowing the concave faces of plurality of microgrippers to engage with a plurality of yarns within the flexible fabric substrate; and
forming mechanical tangles between the gripper arms and the yarns that hold the plurality of microgrippers and attached MEMs devices in place.

2. The method of claim 1 wherein the microelectromechanical device is at least one selected from the group consisting of a sensor, a diode, a transistor, a light emitted diode (LED), an optoelectronic device, an electromagnet and a biomedical device.

3. The method of claim 1 wherein the flexible fabric substrate is a woven or knitted textile.

4. The method of claim 1 wherein the flexible fabric substrate is smart textile.

* * * * *